(12) United States Patent
Nehme et al.

(10) Patent No.: US 12,407,244 B2
(45) Date of Patent: Sep. 2, 2025

(54) DC VOLTAGE FILTER FOR AN INPUT OF AN INVERTER OF AN ELECTRIC MACHINE FOR PROPELLING AN AIRCRAFT

(71) Applicant: SAFRAN ELECTRICAL & POWER, Blagnac (FR)

(72) Inventors: Samir Nehme, Moissy-Cramayel (FR); Sonia Dhokkar, Moissy-Cramayel (FR); Rémi Goncalves, Moissy-Cramayel (FR); Raïs M'Fumu Ambil, Moissy-Cramayel (FR); Rachid Souahlia, Moissy-Cramayel (FR); Jean-Laurent Dievart, Moissy-Cramayel (FR); Abdoulahad Thiam, Moissy-Cramayel (FR)

(73) Assignee: SAFRAN ELECTRICAL & POWER, Blagnac (FR)

( * ) Notice: Subject to any disclaimer, the term of this patent is extended or adjusted under 35 U.S.C. 154(b) by 15 days.

(21) Appl. No.: 18/686,073

(22) PCT Filed: Aug. 21, 2022

(86) PCT No.: PCT/FR2022/051592
§ 371 (c)(1),
(2) Date: Feb. 23, 2024

(87) PCT Pub. No.: WO2023/031534
PCT Pub. Date: Mar. 9, 2023

(65) Prior Publication Data
US 2025/0033489 A1    Jan. 30, 2025

(30) Foreign Application Priority Data
Aug. 31, 2021 (FR) ..................................... 2109101

(51) Int. Cl.
H02M 1/14          (2006.01)

(52) U.S. Cl.
CPC ........... *H02M 1/14* (2013.01); *B60L 2200/10* (2013.01); *B60L 2210/42* (2013.01)

(58) Field of Classification Search
CPC .... H02M 1/14; B60L 220/10; B60L 2210/42; B64D 27/30; B64D 27/34; B64D 27/35; B64D 27/359
See application file for complete search history.

(56) References Cited

U.S. PATENT DOCUMENTS

| 9,620,292 B2 * | 4/2017 | Wen ....................... H01G 4/228 |
| 2010/0327680 A1 * | 12/2010 | Miyachi ............... H02K 11/028 310/71 |

(Continued)

FOREIGN PATENT DOCUMENTS

EP     1 418 660 B1    5/2007

OTHER PUBLICATIONS

International Search Report mailed Nov. 17, 2022, issued in corresponding International Application No. PCT/FR2022/051592, filed Aug. 21, 2022, 6 pages.

(Continued)

*Primary Examiner* — Tye William Abell
(74) *Attorney, Agent, or Firm* — CHRISTENSEN O'CONNOR JOHNSON KINDNESS PLLC

(57) ABSTRACT

A filter includes a positive busbar and a negative busbar that have a positive terminal and a negative terminal, respectively; at least one positive output terminal and at least one negative output terminal, respectively; and two portions, respectively, each portion having parallel folds to define planes which succeed one another. Each plane is inclined relative to the next plane. One of the portions is an internal portion that is fitted inside the other portion, which is an external portion. Each plane of one portion extends in parallel with and facing an associated plane of the other (Continued)

portion. Differential mode capacitors connected between the two portions.

8 Claims, 9 Drawing Sheets

(56) References Cited

U.S. PATENT DOCUMENTS

2012/0274158 A1* 11/2012 Chun ................ H02K 5/203
　　　　　　　　　　　　　　　　　　　310/53
2020/0343824 A1* 10/2020 Bohlländer ............ H05K 7/14

OTHER PUBLICATIONS

Written Opinion mailed Nov. 17, 2022, issued in corresponding International Application No. PCT/FR2022/051592, filed Aug. 21, 2022, 6 pages.

* cited by examiner

DC VOLTAGE FILTER FOR AN INPUT OF AN INVERTER OF AN ELECTRIC MACHINE FOR PROPELLING AN AIRCRAFT

TECHNICAL FIELD OF THE INVENTION

The present invention relates to a DC voltage filter for an inverter input of an electric machine for propelling an aircraft. It also concerns a voltage converter comprising such a filter, an electric drive comprising such a voltage converter and an aircraft comprising such an electric drive.

Technological Background

The electric or hybrid propulsion aircraft, whether conventional, vertical take-off and landing (VTOL) or short take-off and landing (STOL), represent a market with significant prospects and demand for the intra-urban and inter-urban transport for transporting goods and people.

The electric drive is carried out by one or more electric motors, the number varying according to the architecture.

Generally speaking, the power is transmitted from a DC voltage source to the electric motor by a single inverter, and the latter comprises an input filter comprising, in particular, a high-value capacitor that is bulky.

It may be desirable to provide a device that can be compactly integrated into the electric machine.

The prior art relating to the electric motors and the capacitor of the input filter comprises the documents US 2020 343824 A1, US 2012 0274158 A1, EP 1 418 660 B1, U.S. Pat. No. 9,620,292 B2 and US 2010 0327680 A1.

SUMMARY OF THE INVENTION

A DC voltage filter is therefore proposed for an inverter input of an electric machine for propelling an aircraft, comprising:
- a positive busbar and a negative busbar, respectively having two portions each having substantially parallel folds so as to define at least three planes following one another and inclined with respect to one another, one of the portions, referred to as internal, being nested in the other, referred to as external, so that each plane of one extends substantially parallel opposite an associated plane of the other; and
- differential mode capacitors connected between the two portions.

Optionally, the positive busbar and the negative busbar comprise a positive input terminal and a negative input terminal respectively, and/or at least one positive output terminal and at least one negative output terminal respectively. Capacitive input filters are generally provided between global input terminals and the input terminals of the busbars. To avoid a confusion with the global input terminals, the input terminals of the busbars are referred to hereafter as "intermediate".

Optionally, more differential mode capacitors are connected between the central pair or pairs of planes than between the two peripheral pairs of planes.

Optionally, the differential mode capacitors are arranged on an external face of the external portion and/or on an internal face of the internal portion.

Also proposed is a voltage converter comprising:
- at least one power module; and
- a filter according to the invention, each power module being connected to a respective pair of positive and negative output terminals.

An electric drive is also proposed, comprising:
- a voltage converter according to the invention;
- an electric motor;
- an output shaft secured to a rotor of the electric motor, the input filter being arranged around the output shaft so that the portions of the busbars surround the output shaft.

Optionally, several voltage converters are distributed around the output shaft.

Also optionally, the electric drive further comprises a casing surrounding the output shaft and having a plurality of internal or external planar faces in succession around the output shaft, the input filter being pressed against the planar faces of the casing so that each plane of the lower portion extends substantially parallel opposite an associated planar face of the casing.

An aircraft comprising an electric drive according to the invention is also proposed.

BRIEF DESCRIPTION OF THE FIGURES

The invention will be better understood with the aid of the following description, given only by way of example and made with reference to the attached drawings in which.

DETAILED DESCRIPTION OF THE INVENTION

Figure 1:
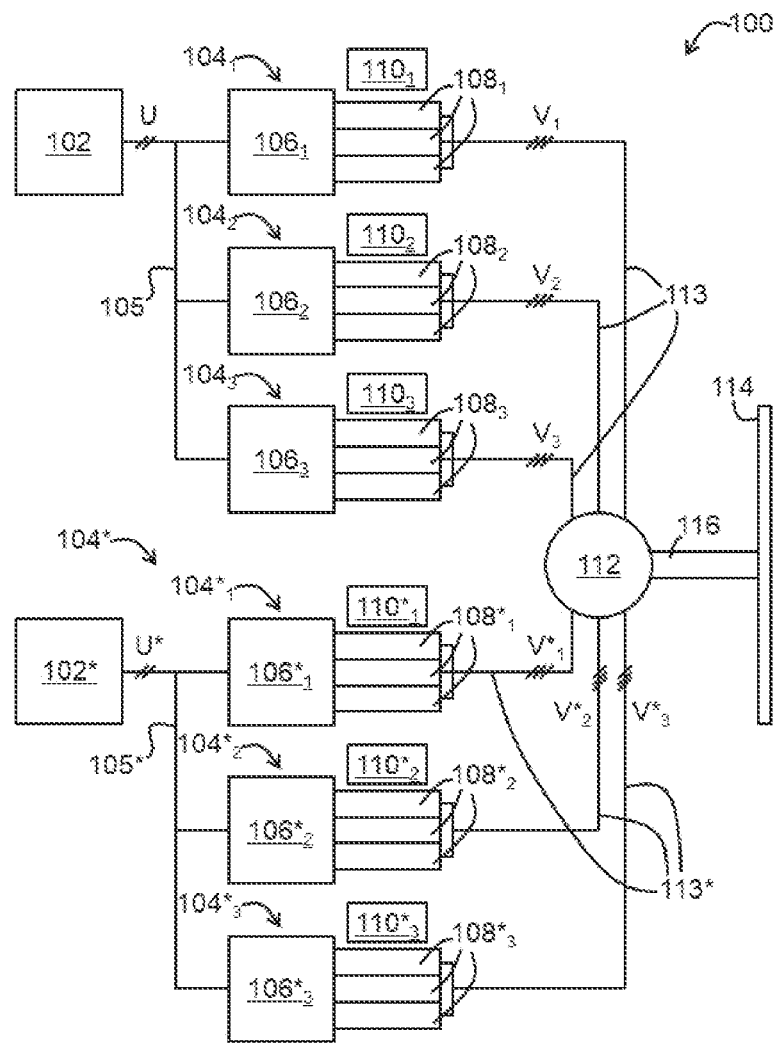
FIG. 1 is a functional view of an example of an electric drive according to the invention for an aircraft.

With reference to FIG. 1, an example of an electric drive 100 for an aircraft will now be described.

The electric drive 100 firstly comprises a DC voltage source 102 designed to supply a DC voltage U. The DC voltage source 102 comprises, for example, one or more batteries.

The electric drive 100 also comprises at least one inverter $104_{1\text{-}3}$ connected by a DC power harness 105 to the DC voltage source 102 and each designed to convert the DC voltage U into a respective AC voltage $V_{1\text{-}3}$. Each AC voltage $V_{1\text{-}3}$ is, for example, a polyphase voltage, in particular a three-phase voltage.

Each inverter $104_{1\text{-}3}$ comprises in particular an input filter $106_{1\text{-}3}$ and, for each input filter, one or more power modules, each designated by the global reference $108_{1\text{-}3}$ and designed to respectively supply the different phase or phases of the AC voltage $V_{1\text{-}3}$ from the DC voltage U after filtering by the input filter $106_{1\text{-}3}$. If the AC voltage $V_{1\text{-}3}$ is three-phase, for example, three power modules $108_{1\text{-}3}$ are provided.

Each inverter 104 also comprises control electronics $110_{1\text{-}3}$ designed to control the power modules $108_{1\text{-}3}$.

Using several inverters 104 in parallel allows to reduce the electrical power passing through each of them.

The electric drive 100 also comprises an electric motor 112 with a stator and a rotor (not shown). The electric motor 112 is, for example, a permanent magnet synchronous motor.

The stator has stator windings (not shown) electrically connected to the power modules $108_{1-3}$ by a polyphase power harness 113 to receive the phases of the AC voltages $V_{1-3}$ respectively. In response to the AC voltages $V_{1-3}$, the stator is designed to generate a rotating magnetic field.

The rotor, for example with a permanent magnet, is designed to be driven in rotation by the rotating magnetic field, in order to drive, for example, a propeller 114 of the electric drive 100, to which the rotor is mechanically connected via an output shaft 116 of the electric drive 100.

Preferably, as shown in FIG. 1, a second electrical supply path is provided with elements similar to those of the first path. These similar elements carry the same reference numbers as those in the first path, with the addition of an asterisk "*". The two paths are preferably independent of each other so that a fault on one path does not cause a fault on the other. In this way, in the event of the loss of a complete path, a minimum supply via the other path can be guaranteed. In particular, this second path preferably comprises a second DC voltage source 102* (independent of the first 102) and inverters $104^*_{1-3}$.

In the example shown, each path comprises three inverters in parallel, each capable of supplying up to 90 kW of electrical power. The electric motor 112 is designed to supply 500 kW of mechanical power. To achieve this, each path supplies 250 kW of electrical power (83.3 kW per inverter on that path).

Figure 2:
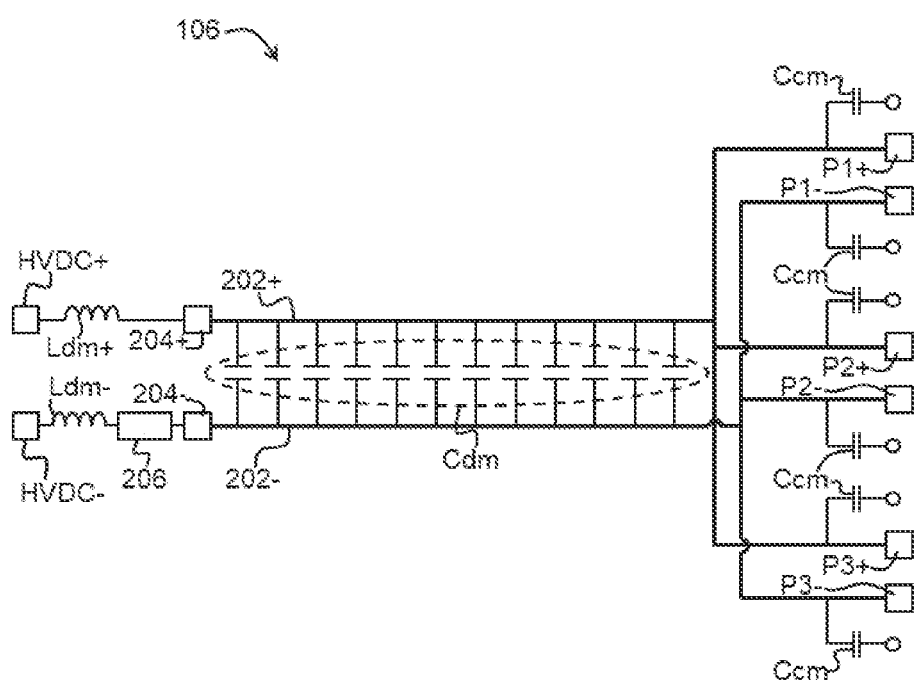
FIG. 2 is an electrical diagram of an example of the input filter of a voltage converter of the electric drive of FIG. 1.

With reference to FIG. 2, one of the input filters $106_{1-3}$, $106^*_{1-3}$ will now be described in more detail. In FIGS. 2 to 6 it will be designated simply by the reference 106, the inverter to which this input filter 106 belongs will be designated simply by the reference 104, and the power modules connected to this filter will be designated simply by the reference 108.

The input filter 106 firstly comprises a positive input terminal HVDC+ and a negative input terminal HVDC− designed to receive the DC voltage U.

The input filter 106 also comprises two differential mode inductors Ldm+, Ldm− respectively connected to the input terminals HVDC+, HVDC−.

The input filter 106 also comprises a positive busbar 202+ and a negative busbar 202−, respectively having a positive intermediate terminal 204+ and a negative intermediate terminal 204− respectively connected to the differential mode inductors Ldm+, Ldm−.

The differential mode inductors Ldm+, Ldm− have a value that ensures a network stability so that the resonance of the filter 106 is independent of the cable length (as far as possible). For example, each differential mode inductor Ldm+, Ldm− is between 2 and 3 pH, for example 2.5 pH.

The positive busbar 202+ also has at least one positive output terminal P1+, P2+, P3+, in particular one for each power module 108.

Similarly, the negative busbar 202− has at least one negative output terminal P1−, P2−, P3−, in particular one for each of the power modules 108 associated with this input filter 106.

The busbars 202+, 202− are rigid electrical conductors, preferably laminated to reduce the switching loop inductor. Reducing the switching loop inductor is important when using power components in order to reduce the losses associated with switching the power modules 108 and to avoid over-voltages at the electric motor input 112.

The input filter 106 also comprises several differential mode capacitors Cdm connected between the busbars 202+, 202−. The number of differential mode capacitors Cdm is preferably high, to allow them to be distributed, as will be explained later. Preferably there should be at least ten of them.

These differential mode capacitors Cdm together have a capacitance value chosen so as to reduce the variation in the DC voltage U and to ensure a sufficient network quality to support the currents of the inverter 104. For example, the equivalent capacitor is between 100 and 200 pF. For example, each capacitor has a value of 12.6 µF for a total of 151 µF for twelve differential mode capacitors Cdm in parallel.

The differential mode capacitors Cdm used are preferably polypropylene type capacitors whose service life depends on the voltage level and temperature. In power equipment, the service life is often given by the service life of the capacities used. So, to increase or guarantee a long service life, it is preferable to optimise the cooling of the differential mode capacitors Cdm.

The input filter 106 also comprises, for each output terminal, a common mode capacitor Cdm connected to the busbar to which that output terminal belongs.

The input filter 106 also comprises a device for measuring the current in at least one of the busbars 202+, 202−. In the example described, the current measuring device is designed to measure the current flowing in the negative busbar 202− and comprises, for example, a resistor 206.

Figure 3:
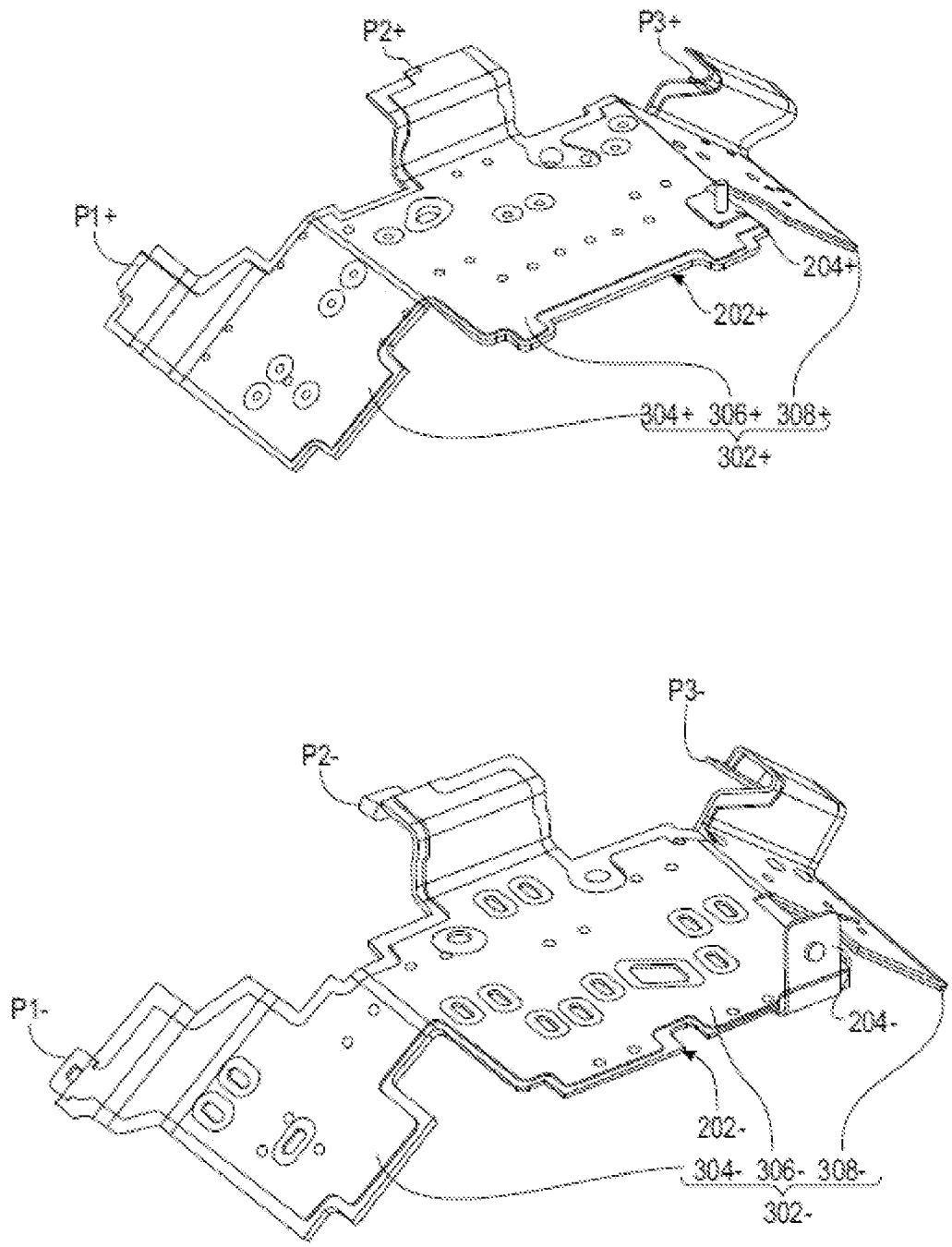
FIG. 3 is a three-dimensional view of the busbars of the input filter in FIG. 2, separated from each other.
Figure 4:
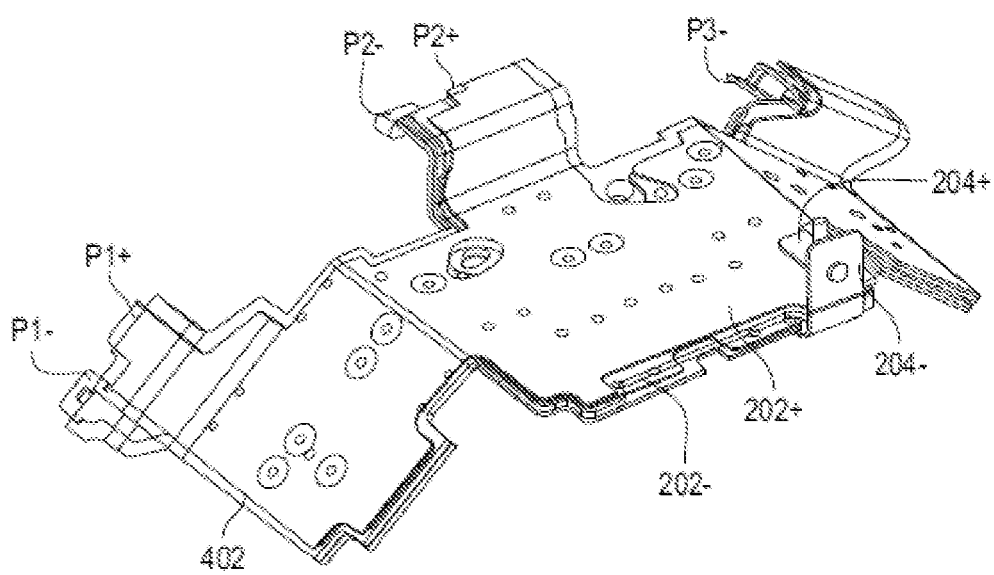
FIG. 4 is a three-dimensional view of the busbars of the input filter in FIG. 2, joined together.

With reference to FIGS. 3 and 4, the busbars 202+, 202− will now be described in more detail.

The busbars 202+, 202− respectively comprise two portions 302+, 302− each having a curved shape, in a single orientation of curvature, and designed to nest into each other so as to extend at a substantially constant distance from each other.

In the example shown, the negative busbar 202− comes to nest in the positive busbar 202+. The positive busbar 202+ will hereinafter be referred to as external, while the negative busbar 202− will hereinafter be referred to as internal. Of course, in other embodiments, the negative busbar 202− could be external and the positive busbar 202+ could be internal.

The curvature of the portions 302+, 302− is obtained by the fact that each portion 302+, 302− has substantially parallel folds in order to define planes which follow one another and are inclined with respect to one another, the inclination always being in the same orientation (no zigzag). In the example shown, each portion 302+, 302− comprises three inclined planes 304+, 306+, 308+ and 304−, 306−, 308−.

Once the busbars 202+, 202− are nested together, each plane of one of the busbars 202+, 202− extends substantially parallel opposite an associated plane of the other of the busbars 202+, 202−. More specifically, in the example shown, the planes 304+, 304− extend opposite each other, as do the planes 306+, 306− and the planes 308+, 308−.

The busbars 202+, 202− are preferably covered with an electrically insulating film 402, which is shown transparently in FIG. 4.

Figure 5:
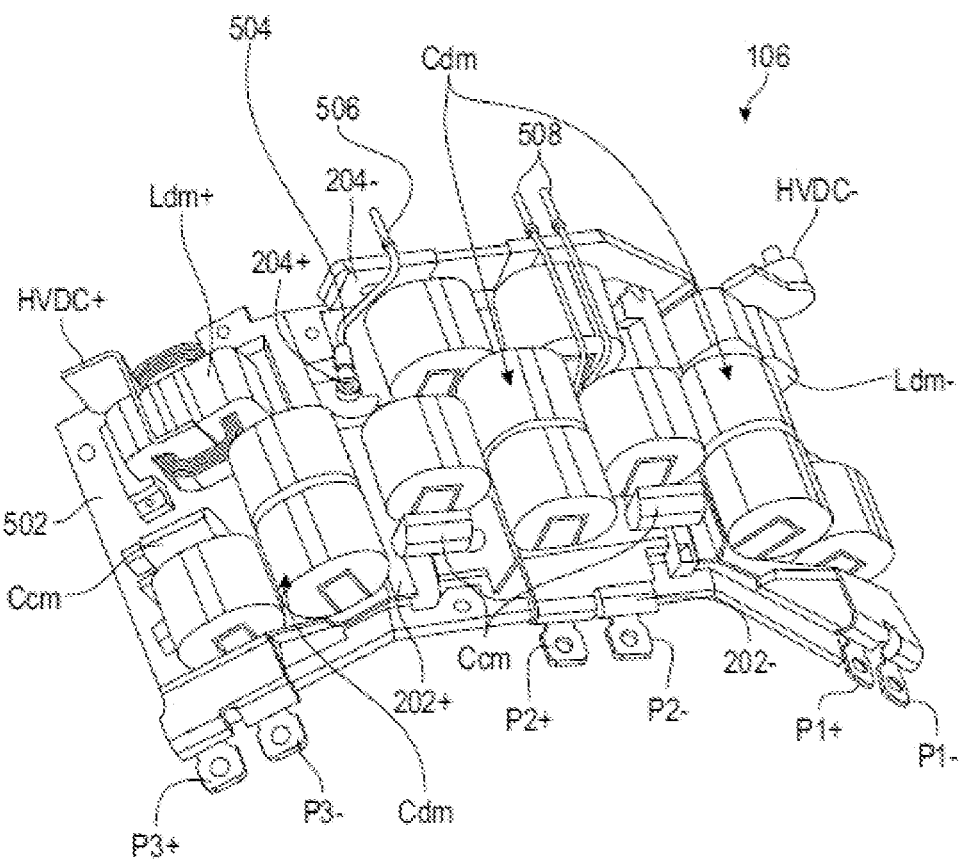
FIG. 5 is a three-dimensional view of the input filter shown in FIG. 2.

With reference to FIG. 5, the differential mode capacitors Cdm are connected between the two portions 302+, 302− of the busbars 202+, 202−. Preferably, the differential mode capacitors Cdm are arranged on an external face of the external busbar and/or on an internal face of the internal busbar. In the example shown, all the differential mode capacitors are arranged on the external face of the positive busbar 202+.

In particular, each pair of planes facing the busbars 202+, 202− carries at least two differential mode capacitors Cdm. Preferably, the central pair of planes (the planes 306+, 306− in the example shown) carries more differential mode capacitors Cdm than the peripheral pairs of planes (the planes 304+, 304− and 308+, 308− in the example described).

Thus, in the example shown, the pair of planes 306+, 306− carries six differential mode capacitors Cdm, while each of the pairs of planes 304+, 304− and 308+, 308− carries three differential mode capacitors Cdm.

In addition, the input filter 106 preferably comprises a base plate 502 carrying the bus plates 202+, 202−. In particular, the base plate 502 is itself curved to nest into the internal busbar and extend at a substantially constant distance from the latter. In the example shown, the base plate 502 comprises three planes extending parallel opposite to the planes 304+, 306+, 308+ of the negative busbar 202−.

The differential mode inductors Ldm+, Ldm− are, for example, carried by the base plate 502. Preferably, a thermal interface is provided between each differential mode inductor Ldm+, Ldm− and the base plate 502 to optimise the cooling towards the base plate 502.

The input filter 106 may also comprise, carried by the busbars 202+, 202− and/or by the base plate 502, a device 504 for measuring the voltage U and a connector 506 for transmitting the voltage measurement.

The input filter 106 may further comprise a device (not visible) for measuring a temperature of the input filter 106, in particular a temperature of one of the differential mode capacitors Cdm and connectors 508 for transmitting the temperature measurement.

For example, the resistor 206 used to measure current comprises a current shunt 510 with two pins 512 between which a voltage is measured to deduce the current.

All or some of these measurements are sent to the control electronics 110 of the power modules 108, to be used to control the switches of the power modules 108. To do this, the control electronics 110 comprises, for example, a module for processing and digitising the measurements, this processing module receiving the connectors 506, 508 and the pins 512.

Figure 6:
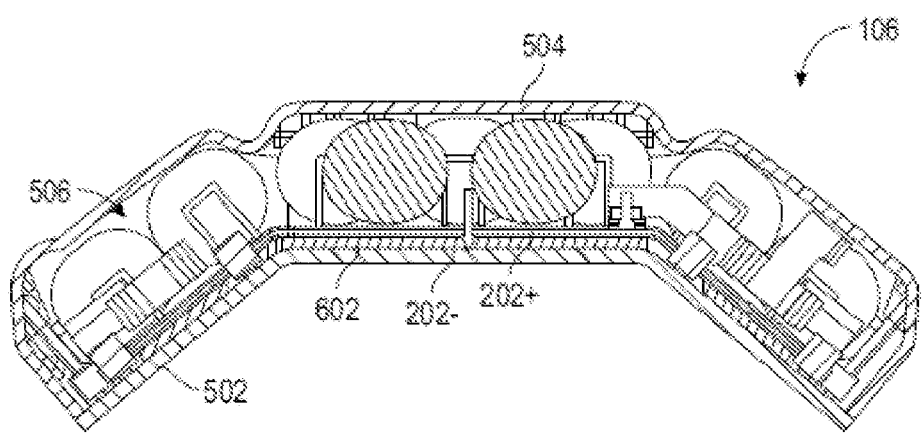
FIG. 6 is a cross-sectional view of the input filter in FIG. 2.

With reference to FIG. 6, an electrically insulating layer 602 is provided between the internal busbar (the negative busbar 202− in the example described) and the base plate 502.

The electrical insulating layer 602 should preferably be able to withstand 1000 V under all altitude and temperature conditions encountered by the aircraft, between the two busbars 202+, 202− and the base plate 502 forming an electrical mass.

The input filter 106 also comprises a housing 504 which comes into contact with the base plate 502 and covers the differential mode capacitors Cdm, as well as, for example, the differential mode inductors Ldm and/or the common mode capacitors Ccm. The housing 504 is for example filled with a thermal insulating material 506, such as a resin, so that the heat generated by the differential mode capacitors Cdm and the differential mode inductors Ccm is dissipated towards the busbars 202+, 202− and then through the base plate 502. Thus, thanks to the thermal insulating material 506, a direct heat transfer between the differential mode inductors Ldm and the differential mode capacitors Cdm is limited. This is because the differential mode inductors Ldm generally heat up much more than the differential mode capacitors Cdm, and the latter generally cannot withstand very high temperatures. In this way, it is possible to place these components close to each other, and thus achieve a good compactness, without the components that heat a lot raising the temperature of the components that heat less and cannot withstand too high a temperature. For example, the thermal insulating material 506 has a thermal conductivity of less than 0.5 W/m/K.

In addition, in the event of a problem with a component, the thermal insulating material 506 is designed to contain an explosion of this component.

Figure 7:
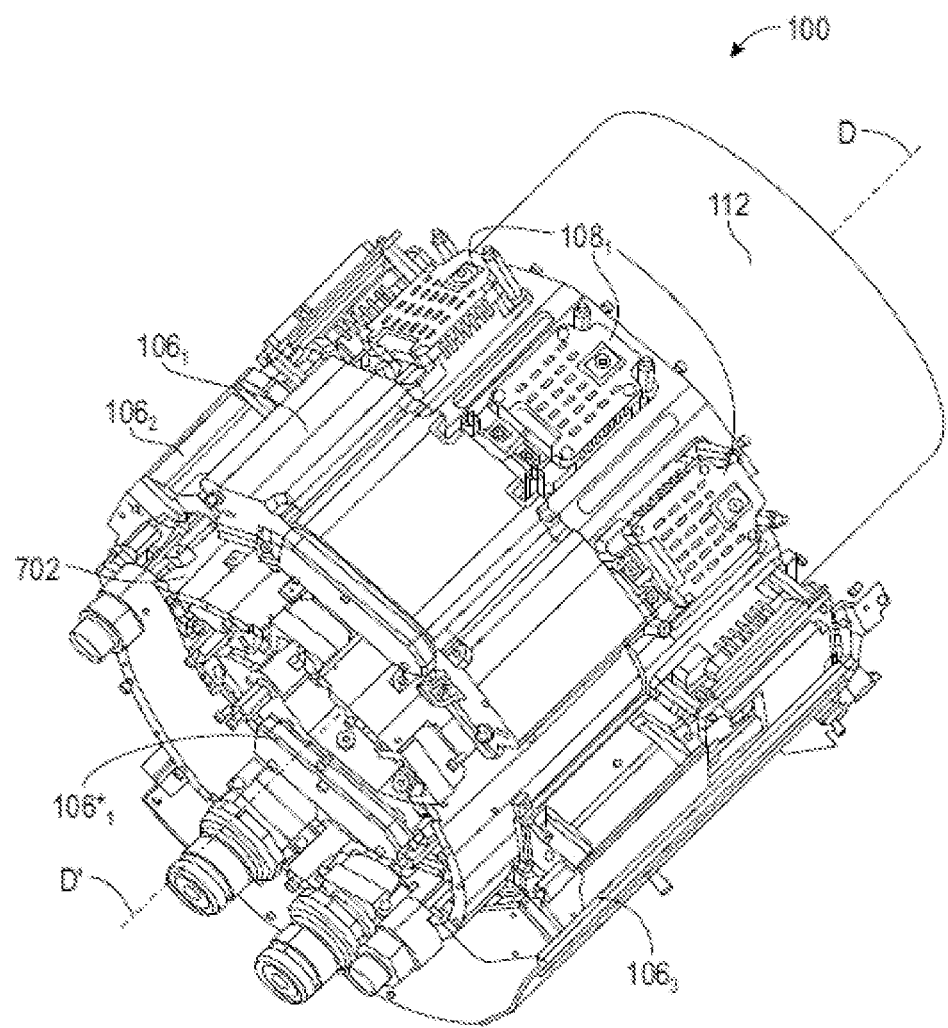
FIG. 7 is a three-dimensional view of an example of a part of an electric drive according to the invention for an aircraft.
Figure 8:
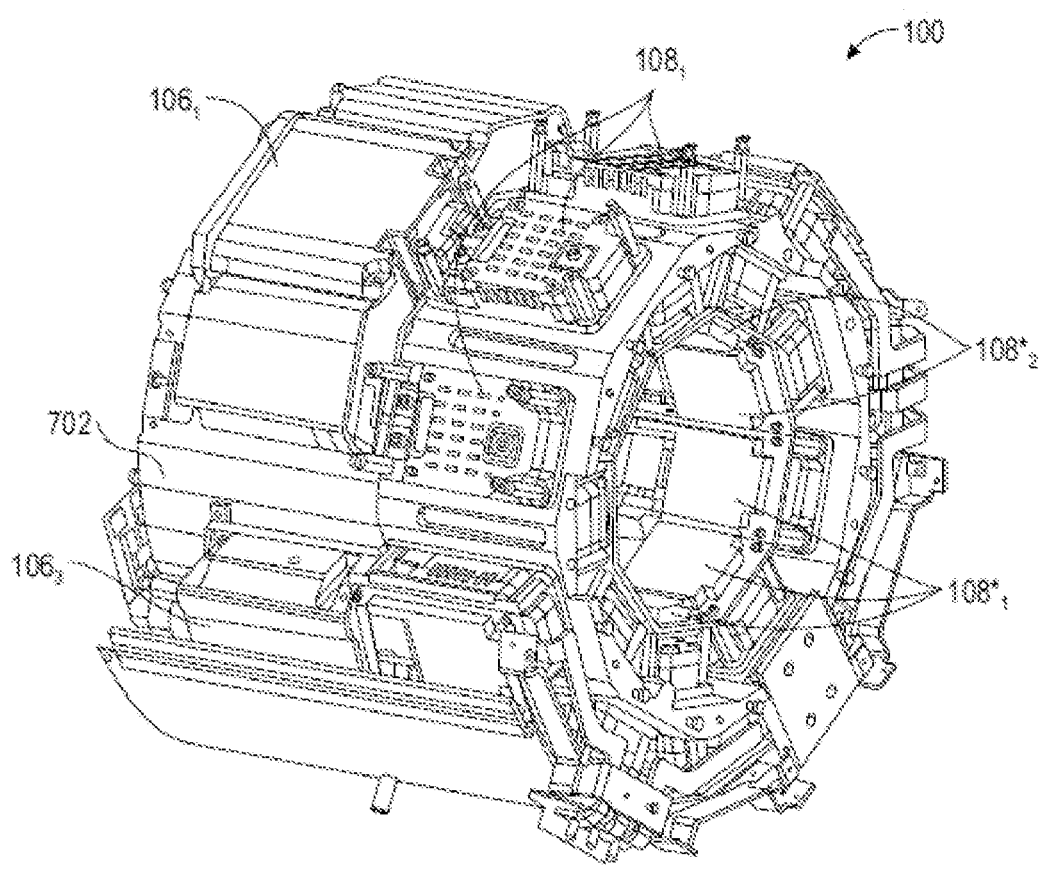
FIG. 8 is a three-dimensional view of the part of the electric drive of FIG. 7, from a different angle.
Figure 9:
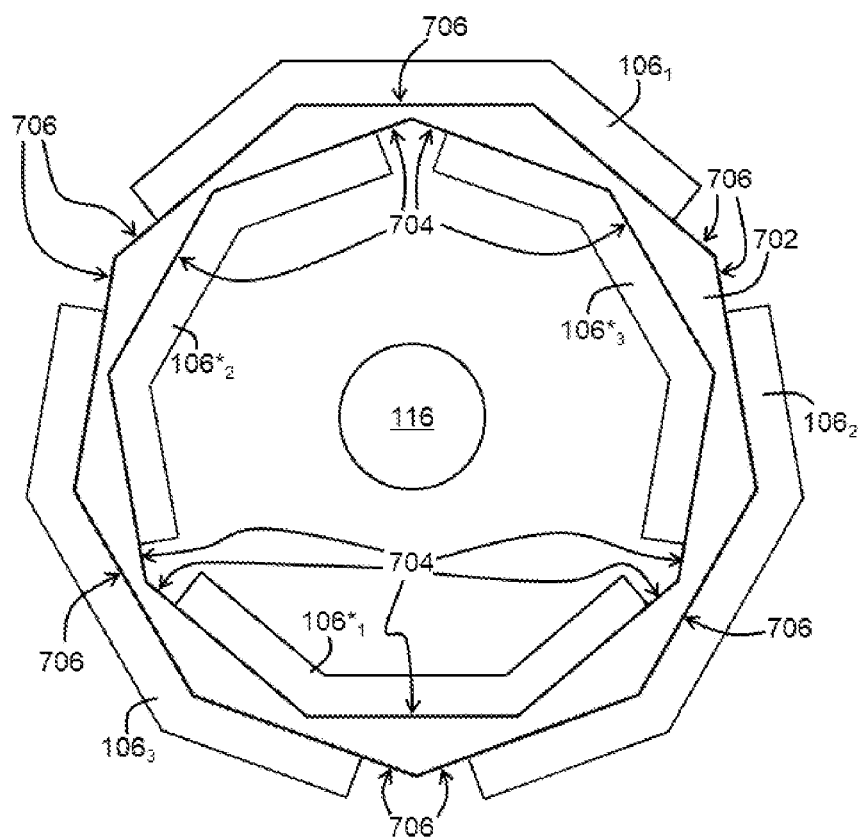
FIG. 9 is a cross-sectional view of the part of the electric drive in FIG. 7.

With reference to FIGS. 7 to 9, an example of integration of the electric drive 100 will now be described.

In this example, each power transmission path comprises three inverters $104_{1\text{-}3}$, $104*_{1\text{-}3}$. The electric drive 100 therefore comprises six input filters $106_{1\text{-}3}$, $106*_{1\text{-}3}$.

The output shaft 116 (not shown in FIGS. 7 and 8) secured to the rotor of the electric motor 112 extends along an axis of rotation DD'.

The electric drive 100 comprises a casing 702 surrounding the output shaft 116 and having a number of planar faces, internal 704 and external 706 in succession around the output shaft 116. Preferably, the internal 704 and external 706 faces have the same number and are substantially angularly offset around the axis of rotation DD' by half a planar face. In the example shown, the casing 702 has nine internal planar faces 704 and nine external planar faces.

The input filters $106_{1\text{-}3}$, $106_{1\text{-}3}*$ are distributed around the axis of rotation DD' with their curvature around the axis of rotation DD'. More specifically, in the example shown, the input filters $106_{1\text{-}3}$ of the first path are pressed against the external faces 706, while the input filters $106*_{1\text{-}3}$ of the second path are pressed against the internal faces 704. In this way, each input filter $106_{1\text{-}3}$, $106*^{1\text{-}3}$ is pressed against planar faces 704 or 706 of the casing 702 so that each base plate 502 (and therefore each plane of the portion of the lower busbar) extends substantially parallel opposite an associated planar face of the casing 702.

In a similar way, the power modules $108_{1\text{-}3}$, $108_{1\text{-}3}*$ are for example distributed around the axis of rotation DD' and placed between the input filters $106_{1\text{-}3}$, $106_{1\text{-}3}*$ and the electric motor 112. More precisely, each power module $108_{1\text{-}3}$, $108*_{1\text{-}3}$ is pressed against an internal 704 or external 706 planar face of the casing 702, in particular against one of the planar faces on which the input filter $106_{1\text{-}3}$, $106_{1\text{-}3}*$ of this power module $108_{1\text{-}3}$, $108_{1\text{-}3}*$ is pressed. The angular offset between the internal faces 704 and the external faces 706 allows the power modules $108_{1\text{-}3}$, $108_{1\text{-}3}*$ to be placed in series one after the other along the same cooling circuit, the latter alternately cooling a power module $108_{1\text{-}3}*$ on an internal face 704, then that on an external face 706, and so on.

The inlet filters $106_{1\text{-}3}$, $106_{1\text{-}3}*$ are compactly integrated into a small, rounded volume. In addition, the length of the polyphase harnesses $113_{1\text{-}3}$, $113_{1\text{-}3}*$ is very short, which allows to reduce the parasitic inductors between the differential mode capacitors Cdm and the power modules $108_{1\text{-}3}$, $108*_{1\text{-}3}$.

In this way, the heat dissipation towards the casing 702 is facilitated by the fact that the busbars 202+, 202− are pressed against the casing 702 (through the base plate 502 in the example described) over a large surface area, due to their curved shape which complements that of the casing 702.

It should be noted that the invention is not limited to the embodiments described above. In fact, it will appear to the person skilled in the art that various modifications can be made to the above-described embodiments, in the light of the teaching just disclosed.

In particular, the input filter could be purely capacitive and not comprise differential mode inductors.

In the foregoing detailed presentation of the invention, the terms used should not be interpreted as limiting the invention to the embodiments exposed in the present description, but should be interpreted to include all equivalents the anticipation of which is within the reach of the person skilled in the art by applying his general knowledge to the implementation of the teaching just disclosed.

The invention claimed is:

1. A filter of DC voltage (U) for an inverter input of an electric machine for propelling an aircraft, comprising:
   a positive busbar and a negative busbar; and
   differential mode capacitors (Cdm) connected between two respective portions of the positive busbar and the negative busbar;
   wherein each of the two portions each have parallel folds so as to define at least three planes following one another and inclined with respect to one another, one of the two portions being an internal portion and the other of the two portions being an external portion, the internal portion being nested in the external portion so that each plane of one of the two portions extends parallel opposite an associated plane of the other of the two portions.

2. The filter of claim 1, wherein more differential mode capacitors (Cdm) are connected between central pair or pairs of planes than between two peripheral pairs of planes.

3. The filter according to claim 1, wherein the differential mode capacitors (Cdm) are arranged on an external face of the external portion and/or on an internal face of the internal portion.

4. A voltage converter comprising:
   at least one power module performing an inverter function; and
   the filter according to claim 1, each power module being connected to a respective pair of positive and negative output terminals.

5. An electric drive comprising:
   the voltage converter according to claim 4;
   an electric motor;
   an output shaft secured to a rotor of the electric motor, the filter being an input filter arranged around the output shaft so that the portions of the busbars surround the output shaft.

6. An aircraft comprising the electric drive according to claim 5.

7. The electric drive according to claim 5, further comprising a plurality of voltage converters distributed around the output shaft.

8. The electric drive according to claim 7, further comprising a casing surrounding the output shaft and having a plurality of internal or external planar faces in succession around the output shaft, the input filter being pressed against the planar faces of the casing so that each plane of a lower portion of the casing extends parallel opposite an associated planar face of the casing.

* * * * *